US007465919B1

(12) United States Patent
Hosea et al.

(10) Patent No.: US 7,465,919 B1
(45) Date of Patent: Dec. 16, 2008

(54) ION DETECTION SYSTEM WITH NEUTRAL NOISE SUPPRESSION

(75) Inventors: Kiki H. Hosea, Amherst, MA (US); Matthew L. Breuer, Hadley, MA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 251 days.

(21) Appl. No.: 11/386,628

(22) Filed: Mar. 22, 2006

(51) Int. Cl.
*H01J 37/244* (2006.01)
*H01J 49/26* (2006.01)

(52) U.S. Cl. ...................................... 250/281; 250/397

(58) Field of Classification Search ......... 250/281-300, 250/397, 489

See application file for complete search history.

(56) References Cited

U.S. PATENT DOCUMENTS 4,996,422 A * 2/1991 Mitsui et al. ................ 250/281
5,464,975 A * 11/1995 Kirchner et al. ............. 250/283
6,025,590 A * 2/2000 Itoi ........................... 250/281
6,545,271 B1 4/2003 Kernan et al.
6,717,138 B2 4/2004 Kernan et al.

* cited by examiner

*Primary Examiner*—Jack I Berman
(74) *Attorney, Agent, or Firm*—Cantor Colburn LLP

(57) ABSTRACT

An ion detection system includes a mass analyzer generating an ion beam along an ion beam longitudinal axis. A field generator generates a field for altering the direction of ions in the ion beam away from the ion beam longitudinal axis. A conversion dynode includes an ion collision region on a conversion dynode surface. A conversion dynode axis passes through the ion collision region perpendicular to the conversion dynode surface, the conversion dynode axis being offset from and not intersecting the ion beam longitudinal axis. An electron multiplier receives secondary charged particles from the conversion dynode generated in response to the ion collision with the conversion dynode surface.

18 Claims, 3 Drawing Sheets

ION DETECTION SYSTEM WITH NEUTRAL NOISE SUPPRESSION

BACKGROUND OF THE INVENTION

Most of the industry standard ion detectors in mass spectrometers are equipped with high voltage conversion dynodes to enhance ion detection, especially for ions having high molecular masses. Ions exiting from a mass analyzer, such as a quadrupole mass filter, are projected to a high voltage conversion dynode so that their collisions with the dynode cause secondary charged particles to be radiated from the dynode surface. These secondary charged particles are repelled by the dynode so as to direct and focus them into the input port of an electron multiplier (e.g., either continuous channel or discrete dynode construction) in order to generate an electrical pulse for further signal processing. Additional ion optic lenses may be installed to increase ion collection from the mass analyzer.

In mass spectrometers, the conversion dynode is positioned such that the axis of symmetry of the ion impact region, on the dynode surface, intersects with the axis of the mass analyzer ion exit aperture. If long-lived, excited or metastable neutrals, which are created during an ionization process, are present among the ions exiting a mass filter, a noise signal is generated under the influence of the conversion dynode high voltage. Metastable neutrals, such as excited helium atoms, for instance, may ionize molecular background gas or may convert to ions under the influence of the conversion dynode high voltage. These ions then strike the dynode surface. This action generates unwanted electrical signal and thereby reduces the signal-to-noise ratio, and thus sensitivity, of the ion detector.

A small aperture may be installed at the ion exit of a mass analyzer to minimize the neutral noise. However, this method will also restrict the ions exiting from the mass analyzer and reduce the ion collection. Improvement of sensitivity, using this method, may not be significant.

The ion detector is one of the crucial components of mass spectrometers of the quadrupole, ion trap, or magnetic sector type, for instance. Electron multipliers, of either the continuous channel or discrete dynode type, have been utilized in ion detectors. It is very desirable to have high signal-to-noise ratios, or high sensitivity, for an ion detector. In industrial standard configurations, high voltage conversion dynodes are typically used to enhance ion collection and ion detection. This is especially true in applications where high molecular masses are able to generate more secondary charged particles due to higher energy collisions with the surface of the dynode. In an effort to increase detector sensitivity, the electron multiplier can be biased as high as the conversion dynode but this has proven to be impractical.

In general, a mass spectrometer, such as a quadrupole type as shown in FIG. 1, includes an ion source 1.1, a mass analyzer 1.2, and an ion detector 1.10. The conversion dynode 1.7 is positioned such that the axis passing through the center of the ion collision point 1.9 and perpendicular to the dynode collision surface 1.8 intersects with the longitudinal axis 1.6 of the ion beam exiting from the mass analyzer 1.2. That is, the axis collinear to the conversion dynode region 1.9 and the input port of the electron multiplier 1.11 intersects the longitudinal axis 1.6 of the ion beam exiting from the mass analyzer. An output plate 1.3 having an aperture may be used to maximize ion throughput. The ions from mass analyzer 1.2, with or without additional ion optics components 1.4, are projected to the dynode surface 1.8 and generate secondary charged particles which are repelled and focused into an input side of an electron multiplier 1.11. An electrical signal is generated after an electron multiplication process.

FIG. 2 shows a conventional ion trap type mass spectrometer including an ion source 2.1, a mass analyzer 2.2, and an ion detector 2.8. The conversion dynode 2.4 is positioned such that the axis that passes through the center of the ion collision position 2.6 perpendicular to the dynode collision surface 2.5 intersects with the longitudinal axis 2.3 of the ion beam exiting the mass analyzer 2.2. That is, the axis 2.7 collinear to the conversion dynode region 2.6 and the input port of the electron multiplier 2.9 intersects the longitudinal axis 2.3 of the ion beam exiting from the mass analyzer. The ions from mass analyzer 2.2, with or without additional ion optics components, are projected to the dynode surface 2.5 and generate secondary charged particles which are repelled and focused into an input side of an electron multiplier 2.9. An electrical signal is generated after an electron multiplication process.

Excited neutrals, such as metastable helium, can be created in an ionization process. If any such neutrals are present at the ion exit of a mass analyzer, neutral noise will be generated. Energetic metastable neutrals may ionize molecular background gas, and it is believed they may become ions under the influence of high voltage or a high electrical field. These ions are vigorously drawn to the surface of the conversion dynode and produce unwanted secondary charged particles. This effect contributes to neutral noise in a mass spectrum. The ion detector of FIG. 1 includes a small aperture ion optics lens assembly 1.4 to limit the neutral stream entering the conversion dynode region. This same detector also has a back-end aperture hole 1.5 in the conversion dynode enclosure to provide an escape pathway for neutrals such as metastable helium. These two features provide a method to reduce neutral noise, but at the cost of reduced ion collection efficiency resulting from lens aperture constrictions.

There is a need for an ion detector that suppresses neutral noise and improves ion detection sensitivity.

BRIEF SUMMARY OF THE INVENTION

An embodiment of the invention is an ion detection system including a mass analyzer generating an ion beam along an ion beam longitudinal axis. A field generator generates a field for altering the direction of ions in the ion beam away from the ion beam longitudinal axis. A conversion dynode includes an ion collision region on a conversion dynode surface. A conversion dynode axis passes through the ion collision region perpendicular to the conversion dynode surface, the conversion dynode axis being offset from and not intersecting the ion beam longitudinal axis. An electron multiplier receives secondary charged particles from the conversion dynode generated in response to the ion collision with the conversion dynode surface.

DETAILED DESCRIPTION

Figure 1:
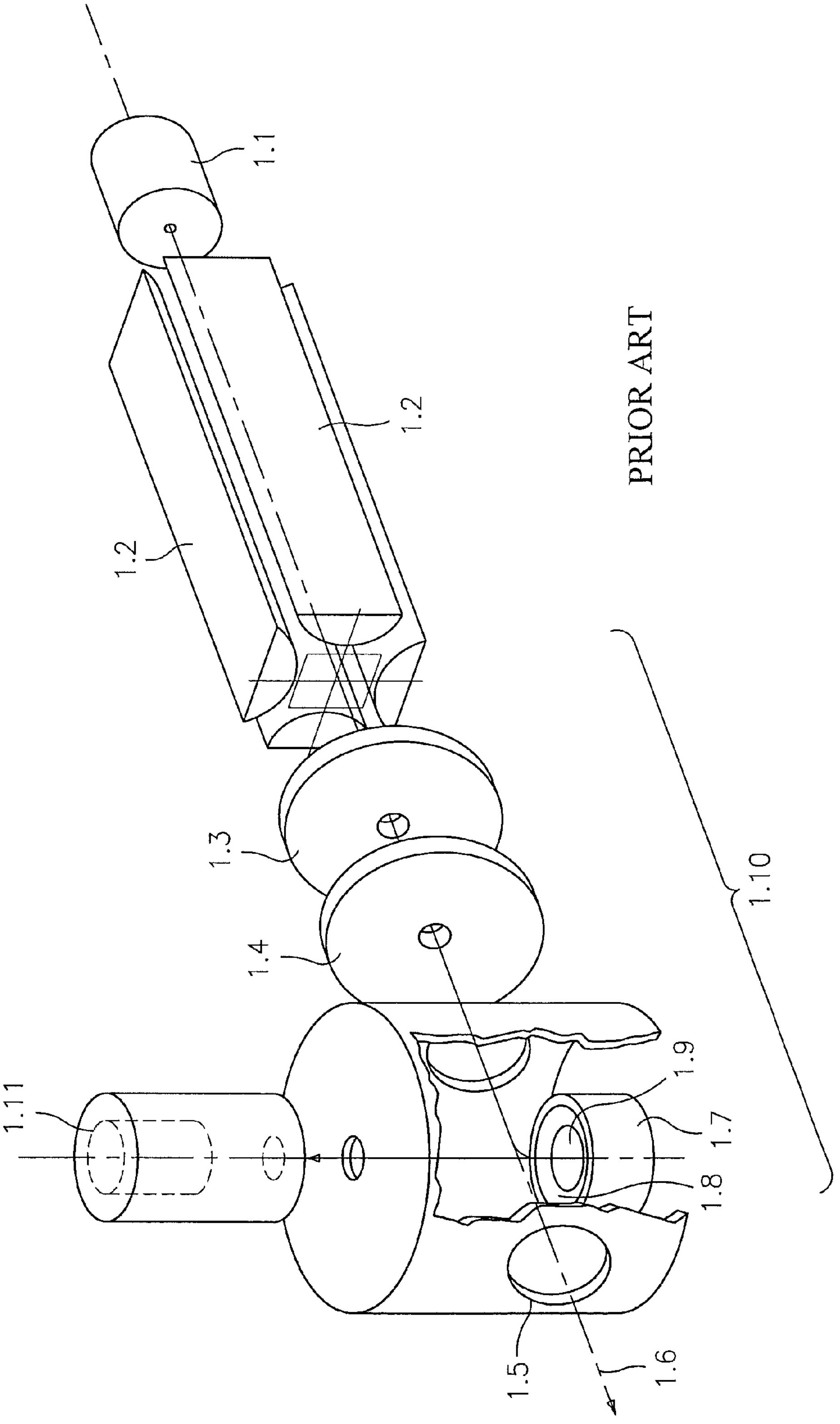
FIG. 1 illustrates a conventional ion detector employing a quadrupole mass analyzer.
Figure 2:
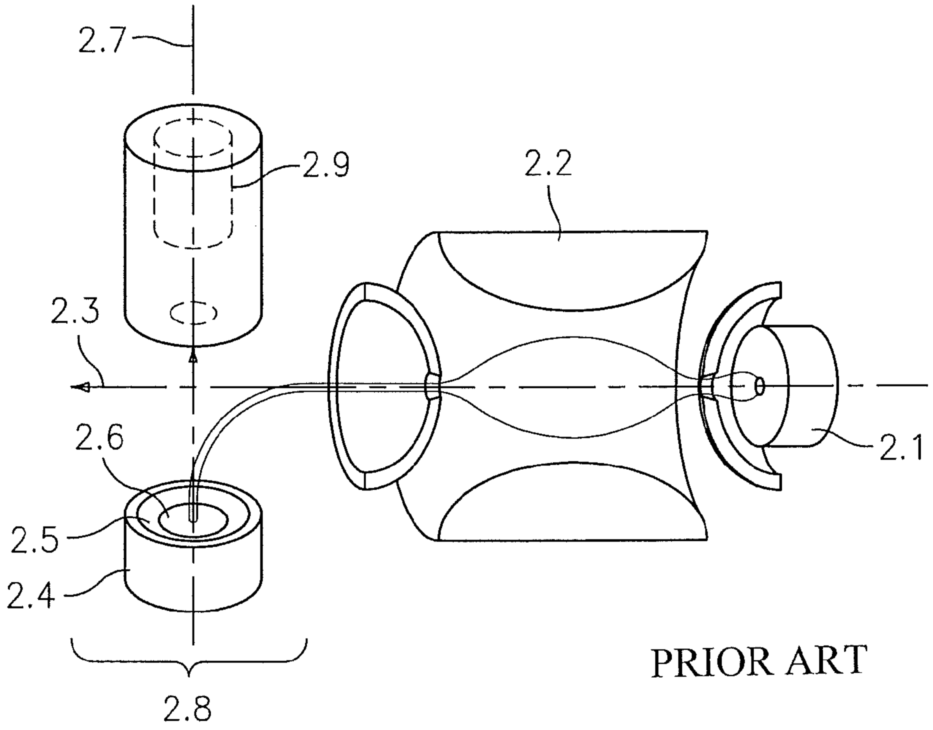
PRIOR ART FIG. 2
FIG. 2 illustrates a conventional ion detector employing an ion trap mass analyzer.
Figure 3:
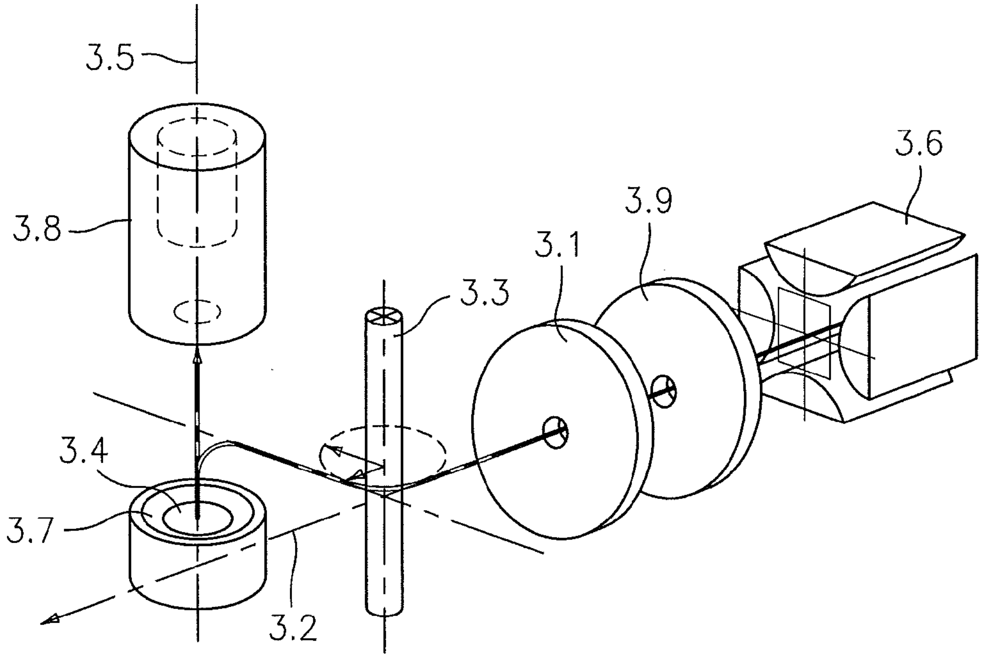
FIG. 3 shows the ion optics configuration according to an embodiment of the invention.

FIG. 3 illustrates an ion optics configuration for suppression of neutral noise. The conversion dynode is positioned such that the conversion dynode axis 3.5 that passes through the center of the ion collision region 3.4 of the conversion dynode and perpendicular to the dynode collision surface 3.7 does not intersect the longitudinal axis 3.2 of the ion exit beam of the quadrupole mass analyzer 3.6. That is, the axis 3.5 collinear to the conversion dynode region 3.4 and the input port of the electron multiplier 3.8 does not intersect the longitudinal axis 3.2 of the ion beam exiting from the mass analyzer 3.6.

In the embodiment of FIG. 3, the trajectory of ions exiting the mass analyzer 3.6 is bent and projected to the ion collision region of the conversion dynode. To achieve this redirection of the ion beam, a field generator in the form of a conducting bending rod 3.3 is positioned adjacent to the axis 3.2 of the ion beam. The conducting bending rod 3.3 is negatively or positively biased, depending upon the polarity of the charged ions being measured. The field of the bending rod 3.3 electrostatically attracts the ions so that the ion trajectory bends around the rod longitudinal axis. The ion trajectory is then bent down onto the ion collision region 3.4 of the conversion dynode as a result of its strong electric field. Secondary charged particles, created after ion-conversion dynode impact, are repelled and focused to an electron multiplier 3.8 for electric pulse generation. Additional ion optics components, such as a lens or lens stack 3.1, may be installed downbeam from the ion exit aperture 3.9, in order to maximize ion collection. Lens aperture size limitations intended to block the metastable neutrals are no longer required since the energetic neutrals will not enter the conversion dynode directly, due to the bending of the ion beam. This arrangement minimizes direct exposure of metastable neutrals to the high voltage from the conversion dynode and, hence, yields a reduction in neutral noise.

Figure 4:
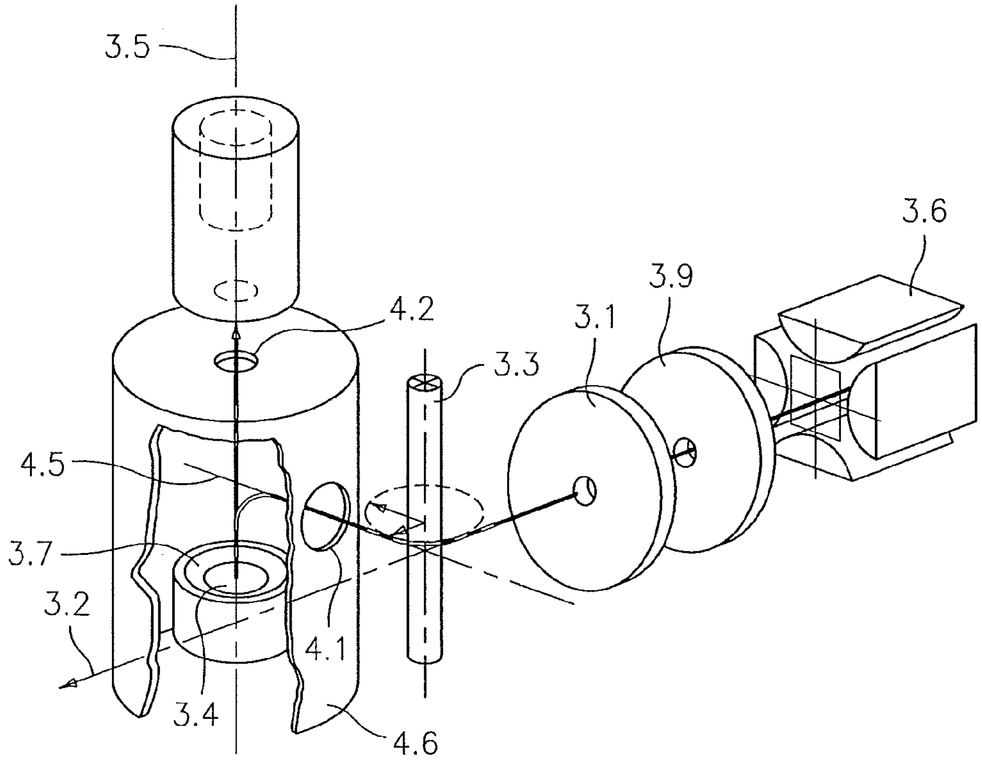
FIG. 4 shows the ion optics configuration according to an alternate embodiment of the invention.

An alternate configuration is shown in FIG. 4, where a conversion dynode shield 4.6, generally constructed of a conductor and being earth grounded, encloses the conversion dynode. In alternate embodiments, shield 4.6 is electrically biased. Other components of this arrangement are the same as those shown in FIG. 3 and are represented with the same reference numerals. This configuration significantly reduces the high electric field exposure of the metastable neutrals emerging directly from the ion exit aperture 3.9 of the mass analyzer 3.6 and limits exposure of the conversion dynode to any excited neutrals reflecting back from chamber wall collisions.

The conversion dynode shield 4.6 has an ion entrance aperture 4.1 formed in the cylindrical outer wall of the shield. An ion exit aperture 4.2 is positioned on a closed end wall of the cylindrical shield 4.6. The other end of the cylindrical shield is open to accept the conversion dynode. It is understood that the cylindrical shape is one example, and other shapes may be used for shield 4.6. The cylindrical shield 4.6 is rotatable about its vertical axis such that the axis 4.5 of the shield ion entrance aperture 4.1 could be rotated to increase or decrease the angle between the axis 4.5 and longitudinal axis 3.2 of the ion beam.

As described above with reference to FIG. 3, the trajectory of ions exiting the mass analyzer 3.6 is bent and projected to the ion collision region 3.4 of the conversion dynode. The embodiment of FIG. 4 uses a conductive bending rod 3.3 as described with reference to FIG. 3.

Figure 5:
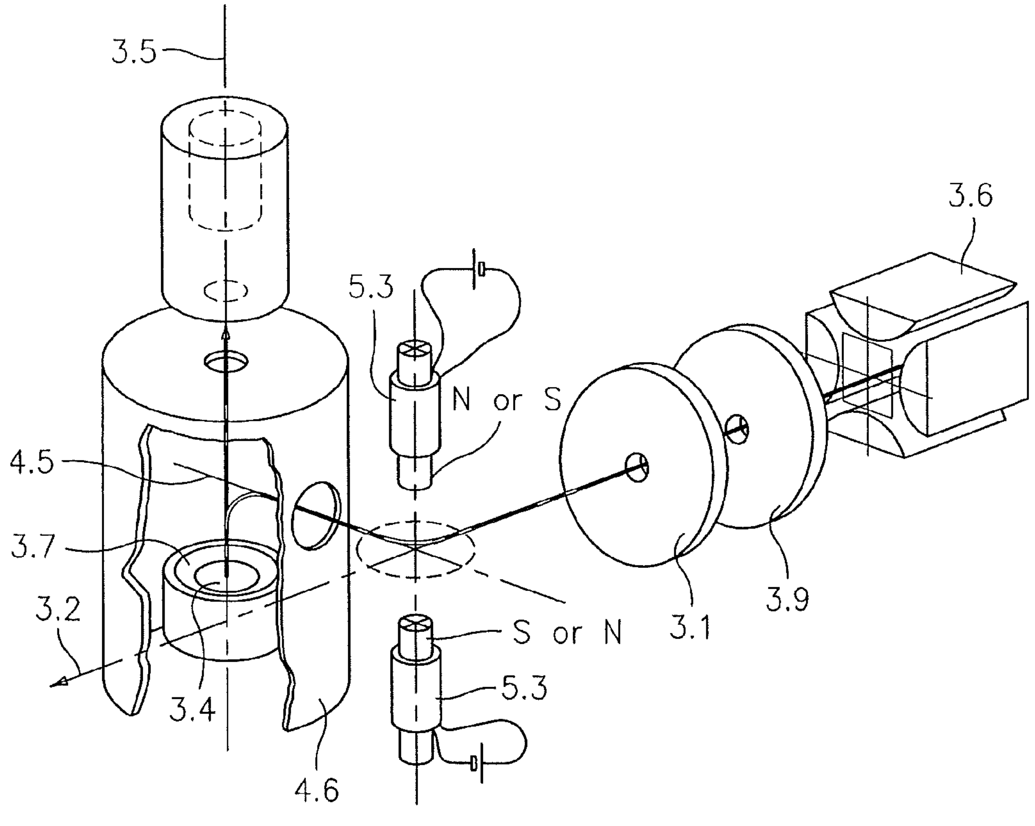
FIG. 5 shows the ion optics configuration according to an alternate embodiment of the invention.

FIG. 5 shows ion trajectory bending resulting from the presence of a magnetic field generated by electromagnets in the form of solenoid type coils 5.3 having a voltage applied to them. Other components of this arrangement are the same as those shown in FIG. 3 and FIG. 4 and represented with the same reference numerals. The solenoids 5.3 are controlled so as to have opposite polarity facing the ion beam in order to establish a magnetic field across the ion beam. The direction of the magnetic field can be reversed by 180 degrees, at will, by reversing the flow of current being applied to these coils. This allows the user to selectively direct ions of one polarity or the other onto the conversion dynode. In alternate embodiments, the magnetic field is generated by permanent magnets having opposite polarity juxtaposed across the ion beam. Alternate embodiments of the invention include the use of electric fields, magnetic fields, or combinations of the two to achieve ion trajectory bending.

Embodiments of the invention overcome the metastable neutral noise issue by positioning the conversion dynode such that the axis oriented normal to the center of the ion-dynode collision area on the face of the dynode does not intersect the ion exit axis of the mass analyzer. This avoids direct metastable neutral exposure to the high field or high voltage from the conversion dynode, and thus suppresses any metastable neutral noise. In addition to the conversion dynode, a shield which is normally earth grounded metal may be installed around the dynode to reduce indirect metastable neutral exposure. This reduces the neutral noise further since it restricts the metastable neutrals from entering the conversion dynode area after they survive collision with various components surrounding the mass analyzer and bounce back to the conversion dynode region. The metastable may be de-excited after sufficient wall collisions and no longer is a potential source of noise.

Ions from a mass analyzer are projected to a conversion dynode by means of ion trajectory bending effect produced by: 1) an electric field from a properly designed electrical conductor or conductors; 2) or magnetic field from shaped magnetic material; 3) or magnetic field produced by a solenoid; 4) or a combination of both electric and magnetic fields. At the conversion dynode surface, secondary charged particles are produced, repelled and focused to the input region of an electron multiplier of either the continuous channel or discrete dynode type. After electron multiplication creates an electrical pulse, this signal exits the output side of the electron multiplier and is then fed into electronic circuitry for further signal processing.

While the invention has been described with reference to exemplary embodiments, it will be understood by those skilled in the art that various changes may be made and equivalents may be substituted for elements thereof without departing from the essential scope thereof. Therefore, it is intended that the invention not be limited to the particular embodiments disclosed for carrying out the invention, but that the invention will include all embodiments falling within the scope of the appended claims.

What is claimed is:

1. An ion detection system comprising:

a mass analyzer generating an ion beam along an ion beam longitudinal axis;

a field generator for generating a field for altering the direction of ions in the ion beam away from the ion beam longitudinal axis;

a conversion dynode including an ion collision region on a conversion dynode surface, a conversion dynode axis passing through the ion collision region perpendicular to the conversion dynode surface, the conversion dynode axis being offset from and not intersecting the ion beam longitudinal axis, an angle between the conversion dynode axis and the ion beam longitudinal axis being less than 180 degrees;

an electron multiplier receiving secondary charged particles from the conversion dynode generated in response to the ion collision with the conversion dynode surface.

2. The ion detection system of claim 1 wherein:

the field generator generates a magnetic field, an electric field or a combination of a magnetic field and an electric field.

3. The ion detection system of claim 2 wherein:

the field is an electric field, the field generator including a charged rod producing the electric field.

4. The ion detection system of claim 2 wherein:

the field is a magnetic field, the field generator including a pair of magnetic elements positioned on either side of the ion beam, the magnetic elements having opposite magnetic polarity.

5. The ion detection system of claim 4 wherein:

the magnetic elements are permanent magnets.

6. The ion detection system of claim 4 wherein:

the magnetic elements are electro-magnets.

7. The ion detection system of claim 1 further comprising:

a conductive shield around the conversion dynode, the conductive shield including an ion entrance aperture receiving ions from the ion beam and an ion exit aperture for receiving the secondary charged particles from the conversion dynode.

8. The ion detection system of claim 7 wherein:

the shield is grounded or the shield is electrically biased.

9. The ion detection system of claim 1 further comprising:

an optical lens assembly positioned along the ion beam longitudinal axis.

10. The ion detection system of claim 1 wherein:

the ion detection system is part of a mass spectrometer of the quadrupole type.

11. The ion detection system of claim 1 wherein:

the ion detection system is part of a mass spectrometer of the ion-trap type.

12. The ion detection system of claim 1 wherein:

the angle between the conversion dynode axis and the ion beam longitudinal axis being is 90 degrees.

13. The ion detection system of claim 1 wherein:

ion beam longitudinal axis is normal to a first plane;

the conversion dynode axis is normal to a second plane;

the first plane and the second plane intersecting and having an angle therebetween, the angle being between 0 degrees and 180 degrees.

14. The ion detection system of claim 1 wherein:

the angle between the first plane and the second plane being 90 degrees.

15. An ion detection system comprising:

a mass analyzer generating an ion beam along an ion beam longitudinal axis along a first axis of a three-dimensional coordinate system;

a field generator for generating a field for altering the direction of ions in the ion beam away from the ion beam longitudinal axis, the direction of the ions being along a second axis of a three-dimensional coordinate system, the second axis being perpendicular to the first axis;

a conversion dynode including an ion collision region on a conversion dynode surface, a conversion dynode axis passing through the ion collision region perpendicular to the conversion dynode surface, the conversion dynode axis being offset from and not intersecting the ion beam longitudinal axis, the conversion dynode axis extending along a third axis of a three-dimensional coordinate system, the third axis being perpendicular to both the first axis and the second axis;

an electron multiplier receiving secondary charged particles from the conversion dynode generated in response to the ion collision with the conversion dynode surface.

16. The ion detection system of claim 15 wherein:

ion beam longitudinal axis is perpendicular to the first axis.

17. The ion detection system of claim 15 wherein:

direction of the ions along the second axis is perpendicular to the second axis.

18. The ion detection system of claim 15 wherein:

conversion dynode axis is perpendicular to the third axis.

* * * * *